United States Patent
Ruderer et al.

(10) Patent No.: US 7,930,660 B2
(45) Date of Patent: Apr. 19, 2011

(54) MEASUREMENT STRUCTURE IN A STANDARD CELL FOR CONTROLLING PROCESS PARAMETERS DURING MANUFACTURING OF AN INTEGRATED CIRCUIT

(75) Inventors: Erwin Ruderer, Markt Schwaben (DE); Walther Lutz, Erding (DE); Roswitha Deppe, Munich (DE)

(73) Assignee: Infineon Technologies AG, Neubiberg (DE)

( * ) Notice: Subject to any disclaimer, the term of this patent is extended or adjusted under 35 U.S.C. 154(b) by 514 days.

(21) Appl. No.: 12/022,176

(22) Filed: Jan. 30, 2008

(65) Prior Publication Data

US 2009/0193367 A1    Jul. 30, 2009

(51) Int. Cl.
*G06F 17/50*    (2006.01)
(52) U.S. Cl. ............. 716/100; 716/50; 716/54; 716/122
(58) Field of Classification Search ............ 716/1, 8–11, 716/17, 21, 50, 54, 100, 122; 430/4, 30
See application file for complete search history.

(56) References Cited

U.S. PATENT DOCUMENTS

| | | | |
|---|---|---|---|
| 2002/0155363 A1* | 10/2002 | Cote et al. | 430/5 |
| 2004/0248016 A1* | 12/2004 | Lucas et al. | 430/5 |
| 2005/0044522 A1* | 2/2005 | Maeda | 716/18 |
| 2006/0294491 A1* | 12/2006 | Becker | 716/18 |
| 2007/0011639 A1* | 1/2007 | Pitts | 716/11 |
| 2007/0278525 A1* | 12/2007 | Acharya | 257/204 |
| 2009/0101940 A1* | 4/2009 | Barrows et al. | 257/204 |

* cited by examiner

*Primary Examiner* — Vuthe Siek (57) ABSTRACT

Implementations are presented herein that relate to a standard cell including a measuring structure for controlling process parameters during manufacture of an integrated circuit. A standard cell is formed in a plurality of material layers of an integrated circuit to perform part of a function of the integrated circuit, wherein the plurality of material layers is configured to be patterned by a plurality of mask layers during manufacture of the integrated circuit, wherein the standard cell includes a measuring structure that is placed within boundaries of the standard cell, wherein the measuring structure includes at least one feature in at least one of the plurality of material layers and the plurality of mask layers, wherein the at least one feature is configured to provide measurement results in order to control process parameters during manufacture of one of the material layers and mask layers.

21 Claims, 7 Drawing Sheets

MEASUREMENT STRUCTURE IN A STANDARD CELL FOR CONTROLLING PROCESS PARAMETERS DURING MANUFACTURING OF AN INTEGRATED CIRCUIT

BACKGROUND

Semiconductor integrated circuits are manufactured by forming patterns in material layers on an appropriate substrate, such as a silicon substrate. The various material layers can be patterned using lithography, wherein a mask layer is used for patterning a material layer. One type of semiconductor lithography involves exposing a patterned mask on the substrate, and using a light source to expose portions of a resist spinned on the substrate, transferring the mask pattern to the resist. The resist is then developed, and the resist is used as a mask while open regions of a material on the substrate are etched away.

The fabrication of an integrated circuit using lithography generally requires device features of precisely controlled size and position to be formed in the mask layers and in the material layers in order to meet the performance targets of the completed integrated circuit. As the size of features in integrated circuits steadily shrinks, control over the dimensions of small features becomes more important. Lithography becomes more difficult, because of operating in the nonlinear subresolution regime. Several phenomenon of optics can prevent the exact transfer of a mask pattern onto a substrate. Therefore, the manufacture of mask layers and material layers requires continual monitoring and measurement to ensure that the dimensions of the patterns being formed are within acceptable ranges.

BRIEF DESCRIPTION OF THE DRAWINGS

The detailed description is described with reference to the accompanying figures. The use of the same reference numbers in different figures indicates similar or identical items.

DETAILED DESCRIPTION

Conventional standard cells are used as building blocks to design an integrated circuit. They include a group of transistors, which provide a logical function, such as a NAND gate or a NOR gate, or a storage function, such as a flipflop or a latch.

Figure 1:
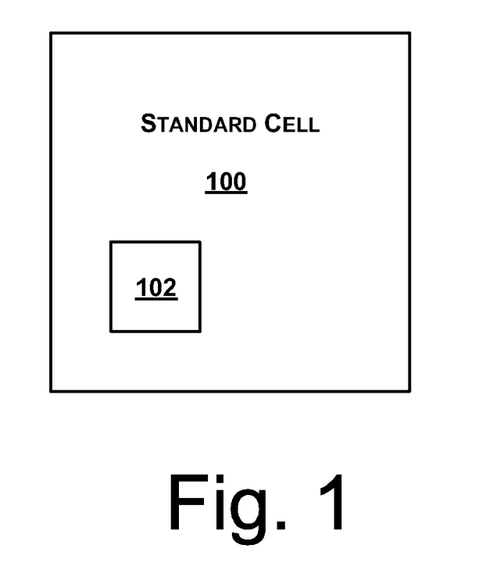
FIG. 1 illustrates a schematic circuit diagram of a standard cell that includes a measuring structure.

FIG. 1 illustrates a schematic diagram of a standard cell 100 in accordance with an implementation described herein. The standard cell 100 includes a measuring structure 102. The standard cell 100 may contain several measuring structures and the measuring structures may be placed at any location within boundaries of the standard cell 100.

The measuring structure 102 may be used to control process parameters during manufacture of a mask. Additionally or alternatively, the measuring structure 102 may be used to control process parameters during manufacture of an integrated circuit. In one implementation, the measuring structure 102 may be used to correlate measurement results that were obtained during manufacture of an integrated circuit with dimensions of a mask that was employed during manufacture of the integrated circuit.

During manufacture of a mask layer or a material layer of an integrated circuit, the measuring structure 102 may be used to monitor a resolution, i.e. a capability of reliably and reproducibly creating a minimum feature size within a specific layer. The minimum feature size may be defined by features of an integrated circuit, such as gate lines, signal lines or vias. Further, the measuring structure 102 may be used to steadily determine a position of a feature both within a layer and with respect to a feature in a subsequent layer.

The measuring structure 102 may include at least one feature of a critical dimension feature, a dense feature, an isolated feature, an overlay feature and a subresolution assist feature.

In one implementation, the measuring structure 102 of FIG. 1 may include a critical dimension feature. The critical dimension feature may include a line or a space having a predetermined width, and the linewidth of the critical dimension feature may match a minimum linewidth of a device feature being printed on an integrated circuit. The minimum linewidth of the device feature may be a gate length of a transistor or a width of a signal line. The length of the line or space may not fall below a predetermined value to avoid rounding off effects at the ends of the line or space. The critical dimension feature may be monitored and measured during manufacture of one of a mask and an integrated circuit to determine that dimensions of features of the mask and the integrated circuit are within predefined limits and to control feature delineation.

In one implementation, the measuring structure 102 of FIG. 1 may include an overlay feature. The overlay feature may be monitored and measured during manufacture of one of a mask and an integrated circuit to control stacking of layers. During manufacture of one of a mask and an integrated circuit, the overlay error may be determined within a material layer or mask layer by measuring a shift between the overlay feature and a virtual grid.

Figure 2A:
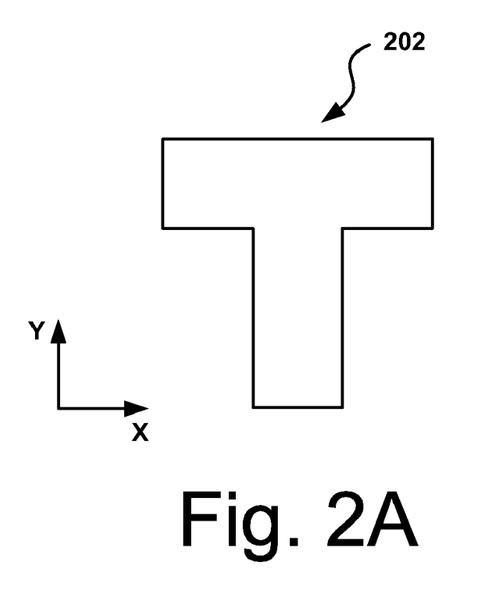
FIG. 2A illustrates a schematic diagram of a T-shaped overlay feature.
Figure 2B:
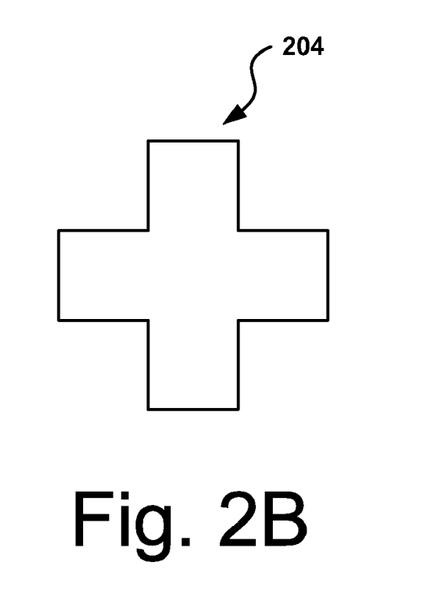
FIG. 2B illustrates a schematic diagram of a cross-shaped overlay feature.

FIG. 2A illustrates a schematic diagram of a T-shaped overlay feature 202 and FIG. 2B illustrates a schematic diagram of cross-shaped overlay feature 204. The overlay feature may extend in both X- and Y-directions of a Cartesian coordinate system as illustrated in FIG. 2A and FIG. 2B. By use of the overlay feature, an overlay error may be determined in X-direction, in Y-direction, or in both X- and Y-directions.

In one implementation, the measuring structure 102 of FIG. 1 may include a subresolution assist feature. The subresolution assist feature may be a narrow line or space placed adjacent to an isolated line or space in order to make an isolated line or space behave lithographically more like a dense line or space. The subresolution assist feature is a feature that is included in a mask layer but is not meant to print on a material layer on a silicon substrate. It may be adjusted in size so that it does not print on a material layer over the needed process window during manufacture of an integrated circuit. During manufacture of an integrated circuit or mask using lithography, an isolated feature may print at a feature size significantly different from a dense feature which may be the same feature as the isolated feature but surrounded by other features. The use of the subresolution assist feature may allow increasing the process window for both isolated and dense features.

Figure 3:
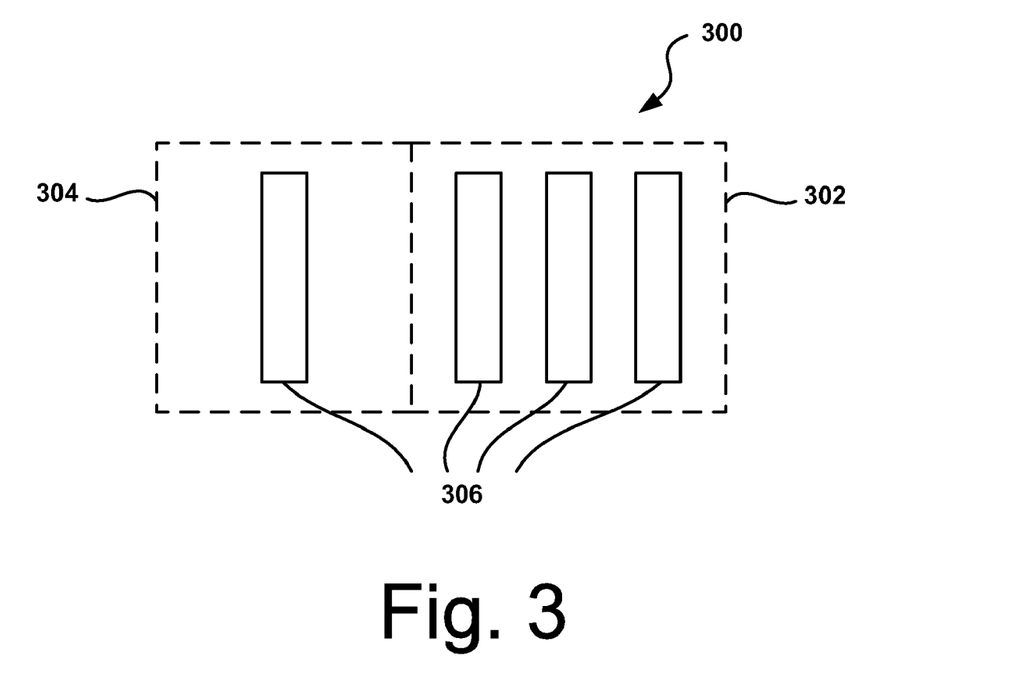
FIG. 3 illustrates a schematic diagram of a measuring structure that includes a dense feature region and an isolated feature region.

FIG. 3 illustrates a schematic diagram of a measuring structure 300. The measuring structure 300 is arranged to provide a dense feature region 302 and an isolated feature region 304, in which critical dimension features 306 are in the form of line segments. It should be understood that the number of features per unit area in the dense feature region 302 is greater than features per unit area in the isolated feature region 304. While the features 306 are all shown to have the same width and the same length, such is not required.

Figure 4:
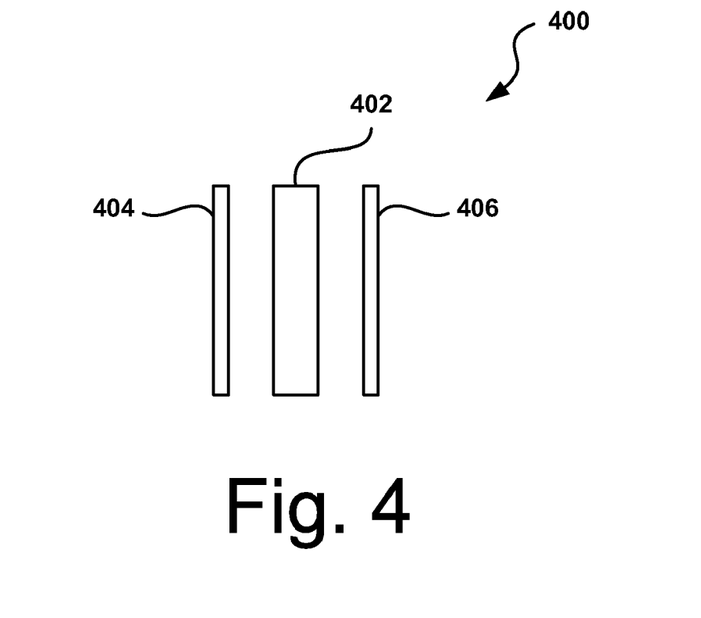
FIG. 4 illustrates a schematic diagram of a measuring structure that includes an isolated feature and subresolution assist features.

FIG. 4 illustrates a schematic diagram of a further measuring structure 400. The measuring structure 400 includes an isolated feature 402 and subresolution assist features 404 and 406. The isolated feature 402 and the subresolution assist features 404 and 406 are in the form of line segments. While the isolated feature 402 and the subresolution assist features 404 and 406 are shown to have the same length, such is not required.

The standard cell as described earlier herein may be part of a standard cell library. Cells of a standard cell library may be compatible with one another, i.e. they may use the same voltage levels, have similar geometries, and the like. During layout design of a semiconductor integrated circuit, a layout creation tool may arrange standard cells of the standard cell library in a predetermined region of a chip layout according to a specified function of the semiconductor integrated circuit. A standard cell of the standard cell library may be a functional cell and the functional cell may contain a group of transistors that together provide an elemental logical function, such as NAND gate, NOR gate, inverter gate, and the like. One or several filler cells may be filled in gaps between functional cells. A filler cell may be a standard cell as part of the standard cell library and the filler cell may not have any logical function. The height of the standard cells of the standard cell library, i.e. the functional cells and the filler cells, may be substantially the same. However, the length of the standard cells may vary depending on the type and complexity of their function.

The filler cell may provide for continuity of power supply throughout an integrated circuit. In the integrated circuit, a voltage rail, for example a power rail or a ground rail, may extend from one functional cell through one or several filler cells to another functional cell. The voltage rail may be placed in a metal layer of the filler cell. As part of one standard cell library, the functional cells and the filler cells may include the voltage rail in the same metal layer.

Figure 5:
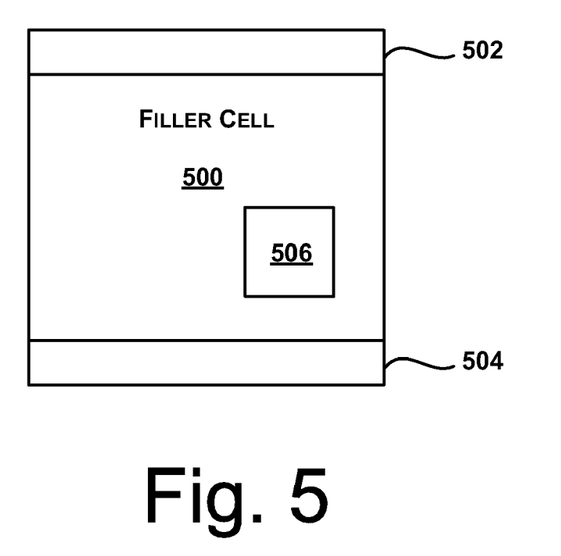
FIG. 5 illustrates a schematic diagram of a filler cell that includes a measuring structure as described in connection with FIGS. 1-4.

FIG. 5 illustrates a schematic diagram of a filler cell 500. The filler cell 500 may be a standard cell as part of a standard cell library. The filler cell 500 may not contain any transistors that provide any logical function. The height dimension of the filler cell 500 may be delimited by voltage rails 502 and 504. The voltage rail 502 may be a power rail and the voltage rail 504 may be a ground rail. The voltage rails 502 and 504 may be placed in a metal layer. The filler cell 500 may include one or several measuring structures 506 as described in connection with FIGS. 1-4. A measuring structure 506 may be placed in the same layer of the filler cell as the voltage rails 502 and 504. In one implementation, one or several measuring structures may be placed in any layer of the filler cell.

Figure 6:
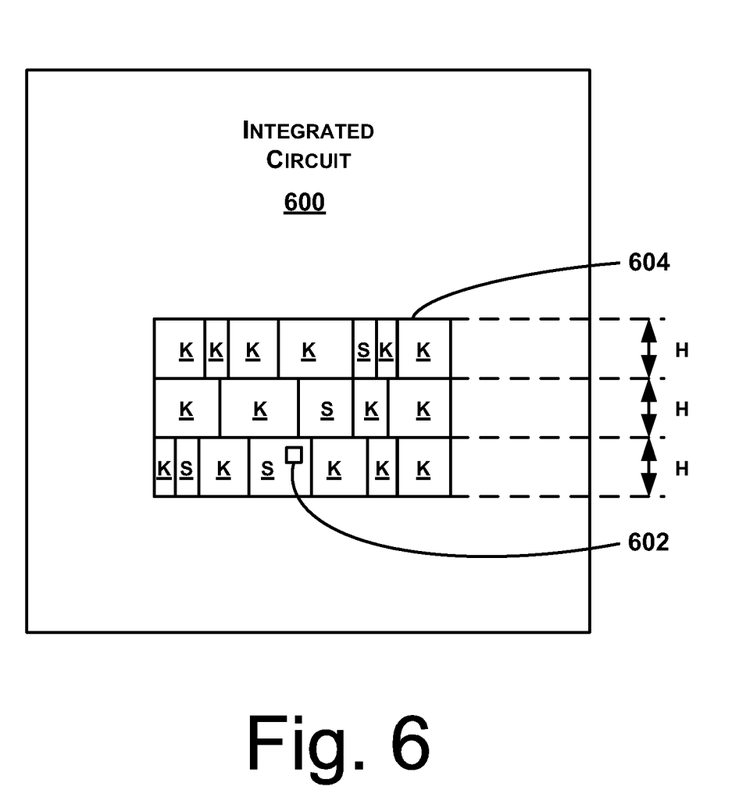
FIG. 6 illustrates a schematic diagram of an integrated circuit that includes a standard cell region. At least one standard cell of the standard cell region includes a measuring structure as described in connection with FIGS. 1-4.

FIG. 6 illustrates a schematic diagram of an integrated circuit 600 comprising standard cells k and s. At least one standard cell of the integrated circuit 600 may include a measuring structure 602 as described in connection with FIGS. 1-4. The integrated circuit 600 contains a standard cell region 604. Additionally, the integrated circuit 600 may contain further regions, e.g., an IO cell region or a memory cell region or further standard cell regions. The standard cell region 604 contains a plurality of standard cells that are arranged in rows and that all have the same parametric height dimension h. The width of the standard cells may vary depending on their type and complexity. The standard cell rows may include functional cells k. The functional cells k may include transistors that form logical gates, such as NAND gates, NOR gates, and the like. Interconnections of terminals of the logic gates between the functional cells are not shown in FIG. 6. Routing wires may be located in one or several metal layers of the integrated circuit. A space between two functional cells k may be filled with one or more filler cells s. One or more filler cells s of the integrated circuit 600 may include a measuring structure 602 as described in connection with FIGS. 1-4. The measuring structure 602 may be electrically isolated and it may not be connected to any signal wire, voltage rail, gate or the like.

Figure 7:
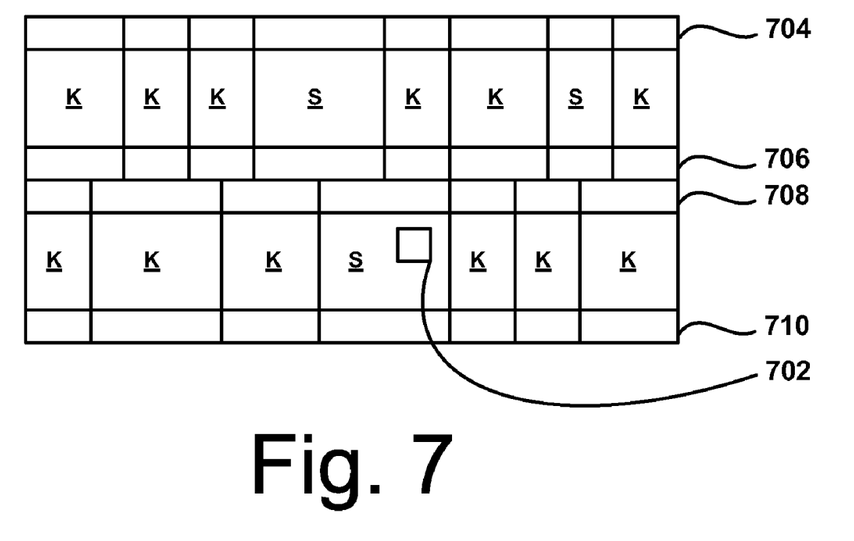
FIG. 7 illustrates a schematic diagram of two rows of standard cells. The standard cells include voltage rails that delimit one dimension of the standard cells.

FIG. 7 illustrates a schematic diagram of two rows of standard cells of an integrated circuit. Filler cells s are created in spaces between functional cells k and at least one filler cell s may include a measuring structure 702. Each filler cell s and each functional cell k may include voltage rails 704, 706, 708 and 710. The voltage rails 704, 706, 708 and 710 may delimit one dimension of the filler cells and functional cells. Voltage rails 706 and 710 may be power rails and voltage rails 704 and 708 may be ground rails. The voltage rails 704, 706, 708 and 710 of the filler cells s may be located in the same metal layer as the voltage rails 704, 706, 708 and 710 of the functional cells k. The voltage rails 704, 706, 708 and 710 may extend from adjacent functional cells k through filler cells s. A filler cell s may fill a space between a first functional cell k and a second functional cell k, and may route a voltage from the first functional cell to the second functional cell. The filler cells s may be used to continue power busses throughout the integrated circuit. The rows of standard cells may not abut, i.e., there may be space between neighboring rows. For example, there may be a space between voltage rail 706 and voltage rail 708. The space between neighboring rows may be a routing channel that gives space for wire routing.

Figure 8:
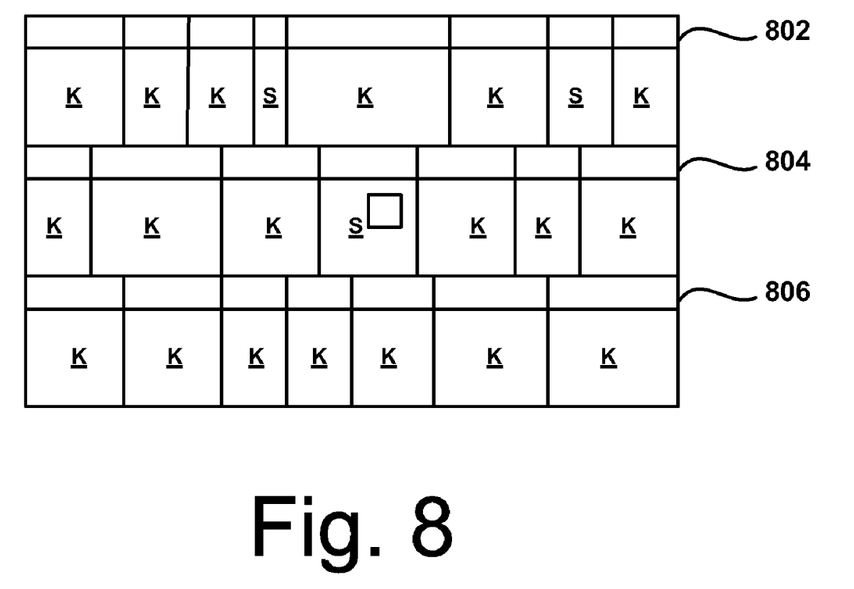
FIG. 8 illustrates a schematic diagram of three rows of standard cells. A voltage rail is shared between adjacent rows of standard cells.

As illustrates in FIG. 8, the standard cells of a row may not have dedicated power and ground rails. A voltage rail 802, 804 and 806 may be shared between adjacent rows of standard cells. One voltage rail may extend along the boundary of adjacent rows of standard cells. The voltage rail may alternately be a power rail and a ground rail. For example, the voltage rail 802 may be a power rail, the voltage rail 804 may be a ground rail and the voltage rail 806 may also be a power rail. Thus, standard cells of adjacent rows may be supplied by a common power rail and a common ground rail.

In one implementation, an integrated circuit contains a plurality of filler cells. Some of the filler cells may contain measuring structures as described earlier herein. Some filler cells may contain other elements, like capacitors to increase capacitance of an integrated circuit where needed, or logical gates that may be connected to functional cells after an engineering change order. Some filler cells may just contain one or several voltage rails. The filler cells of the integrated circuit may belong to one or several standard cell libraries. The filler cells containing the measuring structures may be placed according to a predetermined algorithm. The filler cells containing the measuring structures may be spaced at regular intervals within the integrated circuit, and the distance between two filler cells may not exceed a predetermined value. The presumption is that, if the measuring structures of the filler cells are found to be replicated within predefined limits, the structures within other cells and areas of the integrated circuit are replicated within those limits.

Device features of an integrated circuit, such as gate lines, signal lines or vias, may have dimensions in the nanometer regime. Thin lines on one material layer may be connected to other material layers of the integrated circuit by narrow vias filled with conductive material. Because of resolution limited effects, transfer differences of dimensions in the submicron range may occur when a feature is particularly thin or small. For example, when dimensions of features of an integrated circuit reach small sizes, there may be a tendency for a line formed on a material layer to be shorter than its design length as defined by the lithography mask and the positioning of a via may not be perfectly aligned to the target structure. The accuracy of forming and positioning the lines and the vias may become increasingly critical as dimensions decrease. Relatively minor errors in positioning such features may cause a via to miss a line or to have insufficient overlap with the line, endangering the reliability of a fully functional integrated circuit. A pattern in a material layer may have to be aligned within specified tolerances to a corresponding pattern formed in a previous or subsequent material layer.

The measuring structures as described in connection with FIGS. 1-8 may be used to monitor and control device features of an integrated circuit. The measuring structures may be formed on a mask, and lithography may be utilized to transfer the measuring structures either partly or completely from the mask on a silicon wafer surface. The mask may be utilized together with an exposure tool, for example a stepper equipment or a scanner equipment, to repetitively define a pattern on the silicon wafer surface to form device features of a plurality of integrated circuits. The integrated circuits may be manufactured by patterning a plurality of material layers on a silicon substrate and one or several measuring structures may be included in several mask layers and material layers. The measuring structures may be located at the same position in different layers, i.e. the measuring structures may be stacked. For example, an overlay feature as described in connection with FIGS. 2A and 2B may comprise a first portion that is located in a first layer and a second portion that is located in a second layer. When patterning on a silicon substrate using lithography, the second layer may succeed subsequently on top of the first layer. During manufacture of one of a mask and an integrated circuit, the overlay error may be determined by measuring a shift between the first portion and the second portion.

Alternatively, the measuring structures may be located at different positions in different layers and there may be either some or no overlap between the measuring structures of different layers. For example, a measuring structure may be formed on one or several of a diffusion layer, a polysilicon layer, a metal layer, contact layer and a via layer.

In one implementation, a measuring structure as described in connection with FIGS. 1-8 may be a mask metrology structure that may be included in a mask to control the fabrication process of the mask. For example, a speed of spinning a resist on the mask or a uniformity of a concentration of a developer may be controlled. The mask metrology structure may be included in one or more masks layers that are used in a lithographic process for manufacture of an integrated circuit. The measuring structure may be part of a mask that includes shapes that are critical to the performance of the integrated circuit. For example, the size and location of polysilicon gates, of contacts and of metal wires may have an impact on the performance of the integrated circuit.

In one implementation, a measuring structure as described in connection with FIGS. 1-8 may be a metrology structure that may be used to control process parameters during manufacture of an integrated circuit. The measuring structures may be included in one or more material layers of the integrated circuit. The monitoring of the measuring structure may be accomplished inline between or during various semiconductor fabrication steps. If a monitoring result does not comply with a predefined specification, corrective steps may be taken. For measurement of a metrology structure a metrology tool, for example Scanning Electron Microscope (SEM) or Atomic Force Microscope (AFM), may be applied.

In one implementation, a measuring structure as described in connection with FIGS. 1-8 may be used to control an electrical characteristic of an electrical element during manufacture of an integrated circuit. The electrical element may be a transistor, a resistor or a capacitor. The electrical characteristic may be a threshold voltage or a saturation current of the transistor, a resistance of the resistor or a capacitance of the capacitor. The measuring structure may be included in a material layer on a silicon substrate. In addition, a measuring pad may be included in a material layer on the silicon substrate. The measuring structure is electrically coupled to the measuring pad and an electrical characteristic may be determined by contacting the measuring structure via the measuring pad.

Figure 9:
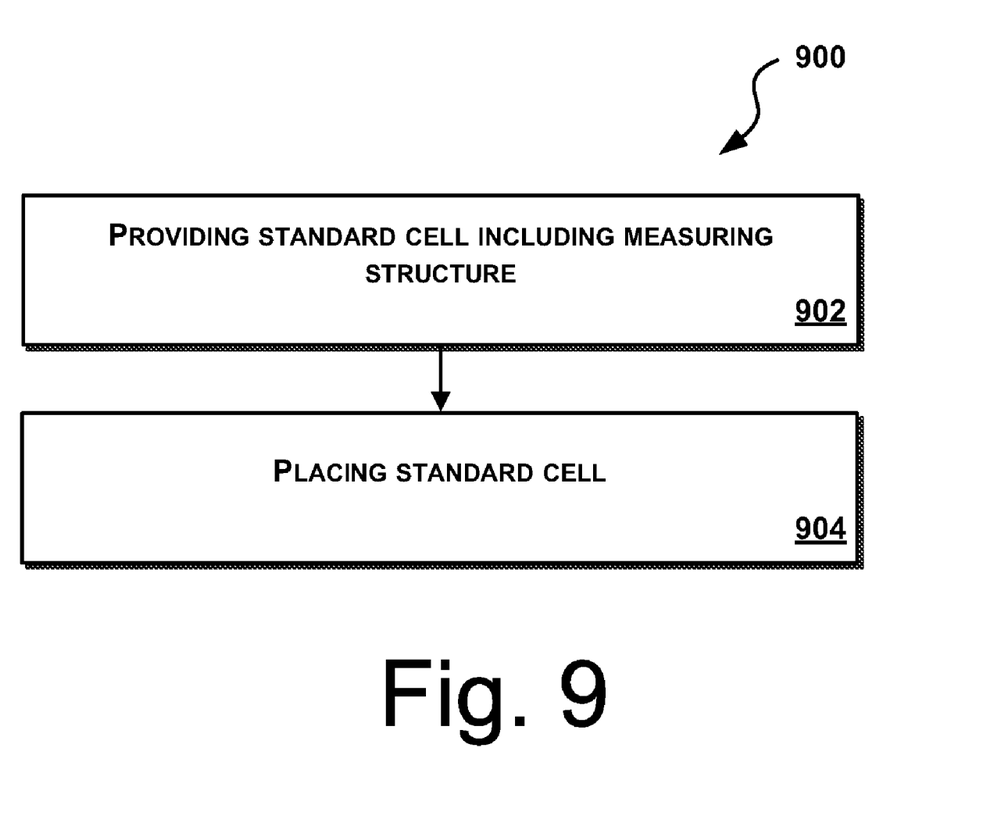
FIGS. 9-10 illustrate flow diagrams that include a number of operations for designing an integrated circuit.
Figure 10:
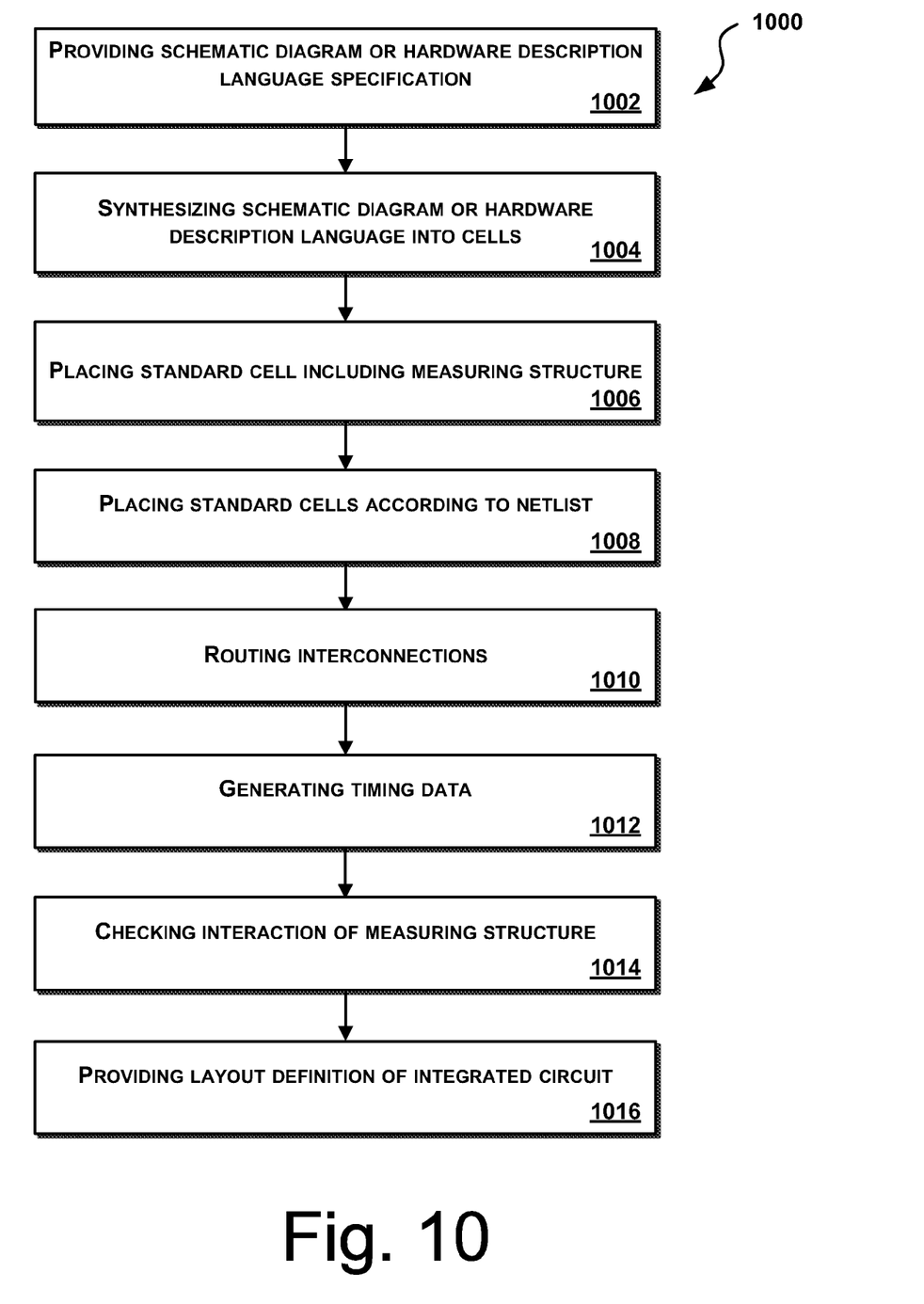

FIG. 9 and FIG. 10 illustrate flow diagrams 900, 1000 that include a number of operations for designing an integrated circuit. Unless stated otherwise, the order in which the operations are described is not intended to be construed as a limitation. Operations may be repetitive, may be combined in any order and/or may be in parallel to implement the process. In portions of the following discussion, reference may be made to the illustrations of FIG. 1-8 and the subject matter thereof. The procedures described in FIG. 9 and FIG. 10 may be realized utilizing the previously described implementations and procedures described in FIG. 9 and FIG. 10 may be combined.

Referring to FIG. 9, at block 902, a standard cell including a measuring structure is provided. The measuring structure may be used to control process parameters during manufacture of a mask. Additionally or alternatively, the measuring structure may be used to control process parameters during manufacture of an integrated circuit. The measuring structure may include at least one of the group of critical dimension feature, dense feature, isolated feature, overlay feature and subresolution assist feature, as described earlier herein.

At block 904, the standard cell including a measuring structure is placed within a placement area of the integrated circuit. Several standard cells including a measuring structure may be placed within the placement area of the integrated circuit according to a predetermined algorithm. The distance between two standard cells including a measuring structure may not exceed a predetermined value.

Referring to FIG. 10, at block 1002, a schematic diagram or a hardware description language (HDL) specification is provided. In the schematic diagram or the HDL specification, functional elements are interconnected to perform a particular logical function of an integrated circuit.

At block 1004, the schematic diagram or the HDL specification is synthesized into cells of a predetermined cell library. With standard cell technology, the schematic diagram or the HDL specification may be synthesized into standard cells of a specific standard cell library. The cells of the standard cell library may be compatible with one another, i.e., they may use the same voltage levels, have similar geometries, and the like. Alternatively, the diagram or the HDL specification may be synthesized into a generic cell library that may be mapped into a specific cell library of a particular manufacturer or technology in a subsequent process step. With a generic cell library, the cell characteristic may include estimates of typical cell propagation delays and a generic model of the cell's function. A netlist of the cells and interconnections may be created.

At block 1006, one or several standard cells including one or several measuring structures are placed within a placement area of the integrated circuit.

At block 1008, standard cells are placed according to the netlist within the placement area, and a layout pattern of the integrated circuit may be formed. The standard cells may be functional cells and may belong to the same standard cell library as the standard cell including measuring structures of block 1006. The standard cells including measuring structures of block 1006 may be filler cells and the filler cells may be placed between the functional cells. The placing operation of block 1008 may be performed automatically by a placement tool.

At block 1010, interconnections between the functional cells may be routed according to the netlist. The interconnections may be routed along predetermined routing areas and routing layers of the integrated circuit. During the processes of placing and interconnecting, a design rule file may be used. The design rule file may include design rule data, such as routing pitch and routing width of a routing layer. The routing operation of block 1010 may be performed automatically by a placement tool.

At block 1012, timing data is generated for electrical signal paths within the integrated circuit. Timing violations may be identified when a signal does not reach a cell at within an appropriate time window. These timing violations may be corrected.

At block 1014, interaction of a measuring structure is checked. In one implementation, interaction between the measuring structure of a filler cell and an adjacent functional cell is checked. If the measuring structure interacts with the adjacent functional cell, the measuring structure may be removed from the filler cell. Additionally or alternatively, interaction between the measuring structure of a filler cell and an interconnection in the integrated circuit is checked. If the measuring structure interacts with the interconnection, the measuring structure may be removed from the filler cell.

One or both of the checks of block 1014 may be performed during a dataprep step, at which physical data of the integrated circuit is prepared for a mask making tool. The checks of block 1014 may be performed based on a file that is provided in a Grid Description Section (GDS) format and a designer of an integrated circuit and a routing tool used during design of an integrated circuit may not have to care for these checks. Alternatively, one or both of the checks of block 1014 may be performed during the placing operation of block 1008 and the routing operation of block 1010.

At block 1016, a layout definition of the integrated circuit is provided, which may include a netlist of the cells and the interconnections between the cells. The layout definition may further include placement data for the cells, routing data for the interconnections between the cells, local cell routing data and cell layout definitions. The integrated circuit layout definition may be used to fabric mask layers of the integrated circuit.

Figure 11:
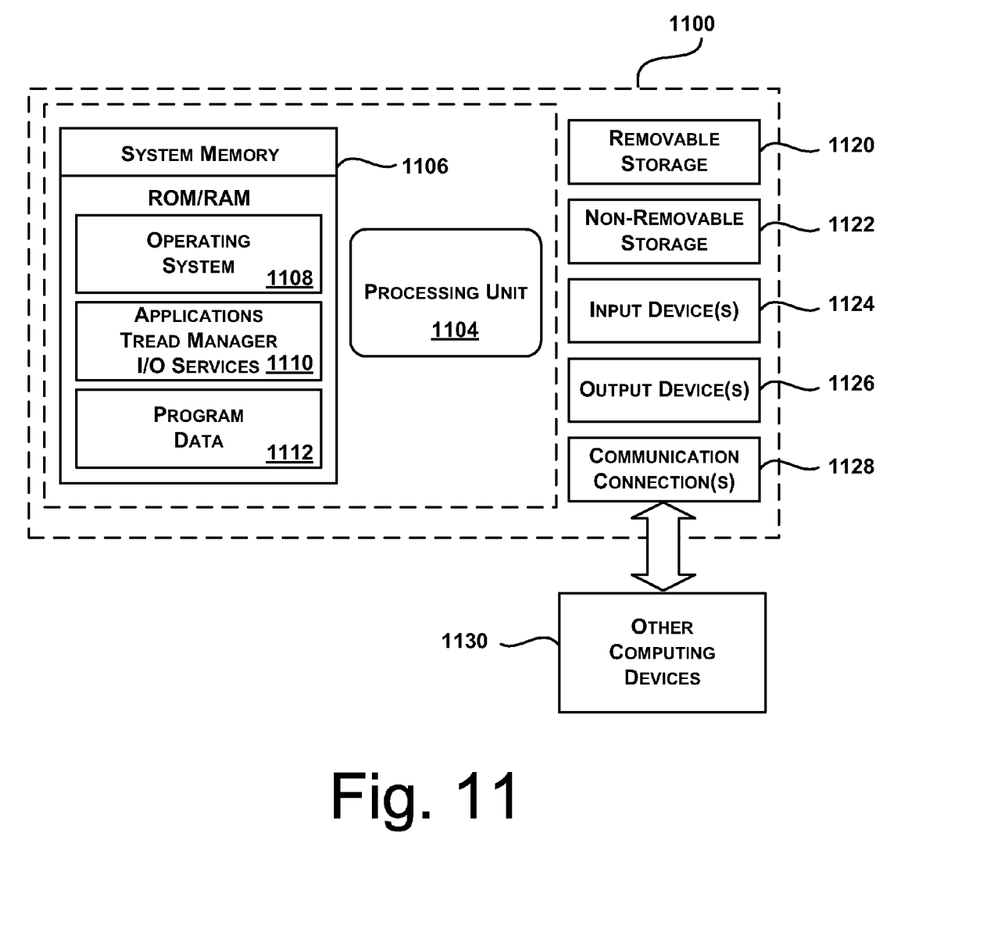
FIG. 11 illustrates a schematic diagram of a computing device.

FIG. 11 is an illustrative computing device 1100 that may be used to implement exemplary implementations described herein. In a very basic configuration, the computing device 1100 includes at least one processing unit 1104 and a system memory 1106. Depending on the exact configuration and type of the computing device 1100, the system memory 1106 may be volatile (such as RAM), non-volatile (such as ROM, flash memory, etc.) or some combination of the two. The system memory 1106 typically includes an operating system 1108, one or more program modules or applications 1110, and may include program data 1112.

The computing device 1100 may have additional features or functionality. For example, the computing device 1100 may also include additional data storage devices (removable and/or non-removable) such as, for example, magnetic disks, optical disks, or tape. Such additional storage is illustrated in FIG. 11 by a removable storage 1120 and a non-removable storage 1122. Computer storage media may include volatile and nonvolatile, removable and non-removable media implemented in any method or technology for storage of information, such as computer readable instructions, data structures, program modules, or other data. The system memory 1106, removable storage 1120 and the non-removable storage 1122 are all examples of computer storage media. Thus, computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by the computing device 1100. Any such computer storage media may be part of the device 1100. The computing device 1100 may also have an input device(s) 1124 such as keyboard, mouse, pen, voice input device, touch input device, etc. An output device(s) 1126 such as a display, speakers, printer, etc. may also be included. These devices are well know in the art and need not be discussed at length.

The computing device 1100 may also contain a communication connection 1128 that allow the device to communicate with other computing devices 1130, such as over a network (e.g. the Internet). The communication connection(s) 1128 is one example of communication media. Communication media may typically be embodied by computer readable instructions, data structures, program modules, or other data in a modulated data signal, such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Computer readable media can be any available media that can be accessed by a computer. By way of example, and not limitation, computer readable media may comprise "computer storage media" and "communications media."

Various modules and techniques may be described herein in the general context of computer-executable instructions, such as program modules, executed by one or more computers or other devices. Generally, program modules include routines, programs, objects, components, data structures, etc. for performing particular tasks or implement particular abstract data types. These program modules and the like may be executed as native code or may be downloaded and executed, such as in a virtual machine or other just-in-time compilation execution environment. Typically, the functionality of the program modules may be combined or distributed as desired in various embodiments. An implementation of these modules and techniques may be stored on or transmitted across some form of computer readable media.

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

What is claimed is:

1. An apparatus for use in an integrated circuit, comprising:
   a standard cell, wherein the standard cell is formed in a plurality of material layers of an integrated circuit to perform part of a function of the integrated circuit,
   wherein the plurality of material layers is configured to be patterned by a plurality of mask layers during manufacture of the integrated circuit,
   wherein the standard cell includes a measuring structure that is placed within boundaries of the standard cell,
   wherein the measuring structure includes at least one feature in at least one of the plurality of material layers and the plurality of mask layers,
   wherein the at least one feature is configured to provide measurement results in order to control process parameters during manufacture of one of the material layers and mask layers.

2. The apparatus of claim 1, wherein the measuring structure comprises at least one feature of a critical dimension feature, a dense feature, an isolated feature, an overlay feature and a subresolution assist feature.

3. The apparatus of claim 1, wherein the standard cell is a filler cell.

4. The apparatus of claim 1, wherein the standard cell comprises a plurality of measuring structures and the plurality of measuring structures is placed in a plurality of layers of the standard cell.

5. The apparatus of claim 1, wherein a metal layer of the standard cell comprises a voltage rail.

6. A standard cell library, comprising:
   a standard cell, wherein the standard cell is formed in a plurality of material layers of an integrated circuit to perform part of a function of the integrated circuit,
   wherein the plurality of material layers is configured to be patterned by a plurality of mask layers during manufacture of the integrated circuit,
   wherein the standard cell includes a measuring structure that is placed within boundaries of the standard cell,
   wherein the measuring structure includes at least one feature that is included in at least one of the plurality of material layers and the plurality of mask layers,
   wherein the at least one feature is configured to provide measurement results in order to control process parameters during manufacture of one of the material layers and mask layers.

7. The standard cell library of claim 6, wherein the measuring structure comprises at least one feature of a critical dimension feature, a dense feature, an isolated feature, an overlay feature and a subresolution assist feature.

8. The standard cell library of claim 6, wherein the standard cell is a filler cell, and further comprising a functional cell, wherein a height of the functional cell and a height of the filler cell is substantially the same.

9. The standard cell library of claim 8, wherein the filler cell and the functional cell comprise a voltage rail in the same metal layer.

10. An integrated circuit, comprising:
    a standard cell, wherein the standard cell is formed in a plurality of material layers of the integrated circuit to perform part of a function of the integrated circuit,
    wherein the plurality of material layers is configured to be patterned by a plurality of mask layers during manufacture of the integrated circuit,
    wherein the standard cell includes a measuring structure that is placed within boundaries of the standard cell,
    wherein the measuring structure includes at least one feature that is included in at least one of the plurality of material layers and the plurality of mask layers,
    wherein the at least one feature is configured to provide measurement results in order to control process parameters during manufacture of one of the material layers and mask layers.

11. The integrated circuit of claim 10, wherein the measuring structure comprises at least one feature of a critical dimension feature, a dense feature, an isolated feature, an overlay feature and a subresolution assist feature.

12. The integrated circuit of claim 10, wherein the standard cell is a filler cell, and further comprising functional cells, wherein the filler cell is arranged between functional cells.

13. The integrated circuit of claim 12, wherein the measuring structure of the filler cell is electrically isolated from the functional cells.

14. The integrated circuit of claim 12, wherein the filler cell is configured to fill a space between a first functional cell and a second functional cell and to route a voltage from the first functional cell to the second functional cell.

15. The integrated circuit of claim 12, wherein the integrated circuit comprises a plurality of filler cells, wherein the filler cells are spaced at regular intervals and wherein the distance between two filler cells does not exceed a predetermined value.

16. A method of controlling process parameters during manufacture of an integrated circuit, comprising:
    providing a standard cell in a plurality of material layers of an integrated circuit to perform part of a function of the integrated circuit;
    wherein the plurality of material layers is configured to be patterned by a plurality of mask layers during manufacture of the integrated circuit;
    providing the standard cell within a placement area of the integrated circuit;
    providing a measuring structure within boundaries of the standard cell;
    providing at least one feature within the measuring structure in at least one of the plurality of material layers and the plurality of mask layers; and
    providing measurement results by the measuring structure in order to control process parameters during manufacture of one of the material layers and mask layers.

17. The method of claim 16, wherein the measuring structure comprises at least one feature of a critical dimension feature, a dense feature, an isolated feature, an overlay feature and a subresolution assist feature.

18. The method of claim 16, wherein the standard cell is a filler cell, and further comprising placing functional cells within the placement area of the integrated circuit, wherein the filler cell is arranged between functional cells.

19. The method of claim 18, further comprising:
checking interaction between the measuring structure of the filler cell and an adjacent functional cell; and
removing the measuring structure from the filler cell if the measuring structure interacts with the adjacent functional cell.

20. The method of claim 18, further comprising:
routing interconnections between functional cells;
checking interaction between the measuring structure of the filler cell and one of the interconnections; and
removing the measuring structure from the filler cell if the measuring structure interacts with the one of the interconnections.

21. A non-transitory computer readable storage medium storing instructions that when executed by a computer cause the computer to perform a method of designing an integrated circuit, the method comprising:
  placing a standard cell within a placement area of the integrated circuit, wherein the standard cell includes a measuring structure that is placed within boundaries of the standard cell,
  wherein the standard cell is formed in a plurality of material layers of the integrated circuit to perform part of a function of the integrated circuit,
  wherein the plurality of material layers is configured to be patterned by a plurality of mask layers during manufacture of the integrated circuit,
  wherein the measuring structure includes at least one feature that is included in at least one of the plurality of material layers and the plurality of mask layers,
  wherein the at least one feature is configured to provide measurement results in order to control process parameters during manufacture of one of the material layers and mask layers.

* * * * *